(12) United States Patent
Matsuda et al.

(10) Patent No.: US 6,642,581 B2
(45) Date of Patent: Nov. 4, 2003

(54) SEMICONDUCTOR DEVICE COMPRISING BURIED CHANNEL REGION

(75) Inventors: Satoshi Matsuda, Yokohama (JP); Atsushi Azuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,950

(22) Filed: Mar. 21, 2002

(65) Prior Publication Data

US 2002/0142529 A1 Oct. 3, 2002

(30) Foreign Application Priority Data

Mar. 29, 2001 (JP) ........................................ 2001-095899

(51) Int. Cl.[7] .................. H01L 29/76; H01L 29/94; H01L 31/062; H01L 31/112; H01L 31/119
(52) U.S. Cl. ...................... 257/369; 257/368; 257/327; 438/291; 438/595; 438/183
(58) Field of Search ............................... 438/183, 291, 438/593; 257/287, 299, 327, 369, 368

(56) References Cited

U.S. PATENT DOCUMENTS

| | | | | |
|---|---|---|---|---|
| 5,856,225 A | * | 1/1999 | Lee et al. | 438/291 |
| 6,087,208 A | * | 7/2000 | Krivokapic et al. | 257/152 |
| 6,319,807 B1 | * | 11/2001 | Yeh et al. | 438/289 |
| 6,353,249 B1 | * | 3/2002 | Boyd et al. | 257/327 |

OTHER PUBLICATIONS

A. Chatterjee et al., "Sub–100nm Gate Length Metal Gate NMOS Transistors Fabricated by a Replacement Gate Process", IEDM, 1997, pp. 821–824.
A. Chatterjee et al., "CMOS Metal Replacement Gate Transistors Using Tantalum Pentoxide Gate Insulator", IEDM, 1998, pp. 777–780.
Yagishita et al., "High Performance Metal Gate MOSFETs Fabricated by CMP for 0.1um Regime", IEDM 1998, pp. 785–788.

* cited by examiner

Primary Examiner—Dung Anh Le
(74) Attorney, Agent, or Firm—Pillsbury Winthrop LLP

(57) ABSTRACT

A semiconductor device includes a gate insulating film formed on a semiconductor substrate between first diffusion layers, a gate electrode including a first gate portion formed on the gate insulating film and a second gate portion formed on the first gate portion, a first width in a channel direction of the first gate portion being substantially equal to a width in that of the gate insulating film, and a second width in the channel direction of the second gate portion being larger than the first width, a gate side wall insulating film including a first side wall portion formed on a side surface of the first gate portion and the gate insulating film and a second side wall portion formed on a side surface of the second gate portion, and a second diffusion layer formed apart from the first diffusion layers below the gate insulating film.

5 Claims, 14 Drawing Sheets

SEMICONDUCTOR DEVICE COMPRISING BURIED CHANNEL REGION

CROSS REFERENCE TO RELATED APPLICATIONS

This application is based upon and claims the benefit of priority from the prior Japanese Patent Application No. 2001-095899, filed Mar. 29, 2001, the entire contents of which are incorporated herein by reference.

BACKGROUND OF THE INVENTION

1. Field of the Invention

The present invention relates to a semiconductor device and a method for manufacturing the same, particularly, to a gate electrode structure of a damascene gate transistor prepared by forming a gate electrode groove in an insulating film, followed by burying a gate electrode in the groove and a method for manufacturing the particular gate electrode structure.

2. Description of the Related Art

A transistor using a metallic material for forming the gate electrode is considered hopeful as a next-generation transistor because this type of transistor is free from deteriorations caused by, for example, a voltage drop derived from the depletion of the gate or the gate resistance, like a transistor using polycrystalline silicon (polysilicon) for forming the gate electrode. However, a metallic material such as W, Al or Cu is incapable of withstanding a high temperature heat treatment. Therefore, the activation temperature for forming the source-drain regions after the processing of the gate electrode should not affect the gate electrode, although the gate electrode is affected by the activation temperature noted above in usual transistor forming processes. As a means for preventing the gate electrode from being affected by the activation temperature in question, a damascene metal gate or replacement gate transistor has attracted attention as described in, for example, "International Electron Devices Meeting Technical Digest, 1998, pp. 777–780, pp. 785–788". The damascene gate or replacement gate transistor is prepared as follows. In the first step, a dummy gate is formed, followed by implanting impurity ions with the dummy gate used as a mask. Then, the implanted impurity is activated so as to form source-drain regions. Further, after removal of the dummy gate, ion implantation is performed for forming a channel region, followed by forming again a gate insulating film and subsequently burying a metal electrode.

However, in the case of using a metallic material for forming a gate electrode, it is difficult to adjust the work function by ion implantation, although ion implantation is employed for adjusting the work function in the case of using polysilicon for forming the gate electrode. Therefore, it is unavoidable to select a material having a work function positioned in the central region of the band gap of silicon, such as TiN, for forming the gate electrode for a CMOS transistor, with the result that it is difficult to realize a low voltage/low threshold value required for a next-generation transistor of reduced the power consumption.

Under the circumstances, in order to lower the threshold value, it is necessary to employ a buried channel structure in which an impurity having a conductivity type opposite that of the semiconductor substrate is implanted in the channel surface.

However, an impurity having a conductivity type opposite that of the impurity used for the adjustment of the threshold value of a surface channel type transistor is implanted in the buried channel type transistor, with the result that a punch-through tends to take place between the source and drain regions, which deteriorates the short channel characteristics.

On the other hand, proposed is a so-called "pocket" or "halo" structure in which an impurity for the punch-through stopper is obliquely introduced by ion implantation after formation of the dummy gate, as shown in FIG. 19A, for improving the short channel characteristics, as described in, for example, "International Electron Devices Meeting Technical Digest, 1998, pp. 789–792".

In the case of using this type of transistor, the impurity concentration is rendered high in the channel portion if the channel is long, compared with a short channel, as shown in FIGS. 19B and 19C, so as to make it possible to sufficiently suppress the punch-through between the source and drain regions.

In this particular structure, however, a junction is formed between the source-drain regions having a high impurity concentration and the region of a high impurity concentration in the halo structure, giving rise to the problems that the junction capacitance between the source-drain regions and the semiconductor substrate, and that the junction leak current is increased. Also, as described previously, a transistor which with a metal gate is considered hopeful as a next generation transistor. However, the activation temperature for forming the source-drain regions after the processing of the gate electrode should not affect the gate electrode, although the gate electrode is affected by the activation temperature noted above in the ordinary process for forming a transistor. As a means for preventing the gate electrode from being affected by the activation temperature in question, a damascene metal gate in which the metal noted above is buried attracts attention. However, since the work function of the metal electrode is positioned in the vicinity of the mid gap of silicon, it is unavoidable to that the buried channel structure has poor short channel characteristics.

It should also be noted that, since a gate insulating film is formed again after removal of the dummy gate once formed and the oxide film positioned below the dummy gate for burying an electrode material in the gate insulating film formed again, it is highly possible for a problem to be generated in terms of the reliability of the gate edge.

BRIEF SUMMARY OF THE INVENTION

According to a first aspect of the present invention, there is provided a semiconductor device, comprising a semiconductor substrate; a pair of first diffusion layers formed within the semiconductor substrate; a gate insulating film formed on that portion of the semiconductor substrate which is positioned between the paired diffusion layers; a gate electrode including a first gate portion formed on the gate insulating film and a second gate portion formed on the first gate portion, a first width in a channel direction of the first gate portion being substantially equal to a width in the channel direction of the gate insulating film, and a second width in the channel direction of the second gate portion being larger than the first width; a gate side wall insulating film including a first side wall portion formed on a side surface of the first gate portion and on a side surface of the gate insulating film and a second side wall portion formed on a side surface of the second gate portion; and a second diffusion layer formed apart from the first diffusion layers within that portion of the semiconductor substrate which is positioned below the gate insulating film.

According to a second aspect of the present invention, there is provided a semiconductor device, comprising a semiconductor substrate; a pair of first diffusion layers formed within the semiconductor substrate; a gate insulating film including a first insulating film portion formed on that portion of the semiconductor substrate which is positioned between the first diffusion layers and a second insulating film portion positioned on both edges of the first insulating film portion, a thickness of the second insulating film portion being larger than a thickness of the first insulating film portion; a gate electrode formed on the gate insulating film; a gate side wall insulating film formed on a side surface of the gate electrode and on a side surface of the second insulating film portion; and a second diffusion layer formed apart from the first diffusion layers within that portion of the semiconductor substrate which is positioned below the first insulating film portion.

According to a third aspect of the present invention, there is provided a method of manufacturing a semiconductor device, comprising forming a first material layer on a semiconductor substrate; forming a second material layer comprising a first width on the first material layer; partly removing the first material layer to leave the first material layer comprising a second width smaller than the first width below the second material layer; introducing an impurity into the semiconductor substrate with the second material layer used as a mask to form an extension region; forming a gate side wall insulating film on a side surfaces of the first and second material layers, the gate side wall insulating film including a first side wall portion formed on the side surface of the first material layer and a second side wall portion formed on the side wall of the second material layer; introducing an impurity into the semiconductor substrate with the gate side wall insulating film and the second material layer used as a mask to form source and drain regions; forming an interlayer insulating film on the semiconductor substrate, on the second material layer and on the gate side wall insulating film, followed by removing the interlayer insulating film until the second material layer is exposed; removing the first and second material layers to form a groove; introducing an impurity through the groove into the semiconductor substrate to form a second diffusion layer apart from the extension region within that portion of the semiconductor substrate which is positioned below the groove; forming a gate insulating film on that portion of the semiconductor substrate which is positioned within the groove; and forming a gate electrode on the gate insulating film positioned within the groove.

According to a fourth aspect of the present invention, there is provided a method of manufacturing a semiconductor device, comprising forming a gate insulating film on a semiconductor substrate; forming a second material layer comprising a predetermined shape on the gate insulating film; thermally oxidizing the second material layer and the semiconductor substrate to form a first insulating film on an upper surface and a side surface of the second material layer and to increase a thickness in a portion of the gate insulating film; partly removing the first insulating film and the gate insulating film to form a first gate side wall insulating film on the side surface of the second material layer and to form a second insulating film portion of the gate insulating film positioned below both edges of the second material layer comprising a thickness larger than a thickness of the first insulating film portion of the gate insulating film below a central portion of the second material layer; introducing an impurity into the semiconductor substrate with the second material layer and the first gate side wall insulating film used as a mask to form an extension region; forming a second gate side wall insulating film on a side surface of the first gate side wall insulating film; introducing an impurity into the semiconductor substrate with the second material layer and the first and second gate side wall insulating films used as a mask to form source-drain regions; forming an interlayer insulating film on the semiconductor substrate, the second material layer and the first and second gate side wall insulating films, followed by removing the interlayer insulating film until the second material layer is exposed; removing the second material layer to form a groove; introducing an impurity through the groove into the semiconductor substrate to form a second diffusion layer apart from the extension region within that portion of the semiconductor substrate which is positioned below the first insulating film portion; and forming a gate electrode on the gate insulating film positioned within the groove.

DETAILED DESCRIPTION OF THE INVENTION

Figure 1:
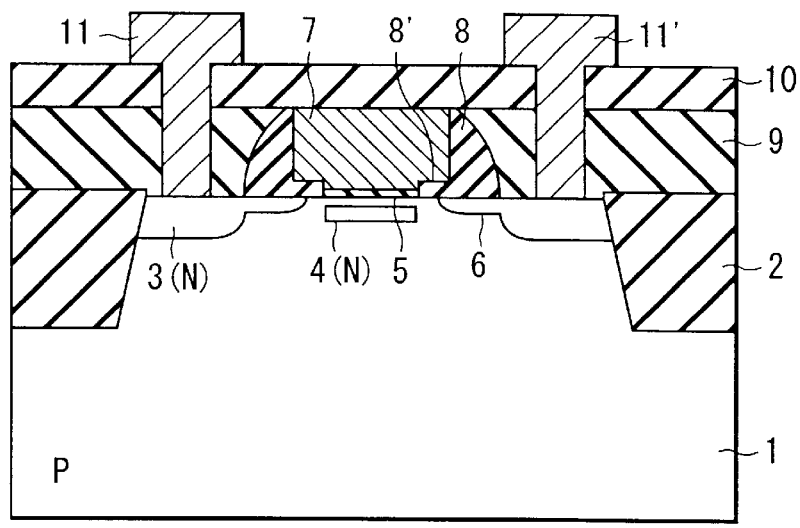
FIG. 1 is a cross sectional view showing the construction of a semiconductor device according to a first embodiment of the present invention.

Embodiments of the present invention is directed to a damascene gate transistor in which a gate electrode groove is formed in an insulating film and a gate electrode is buried in the gate electrode groove thus formed. In embodiments of the present invention, the surface of a silicon substrate in which is formed a channel is oxidized so as to form a dummy gate made of, for example, polysilicon, followed by subjecting the silicon oxide film right under the dummy gate to a side etching. Then, a side wall insulating film made of, for example, silicon nitride (SiN) is buried in the groove formed by the side etching so as to form a projecting portion of the side wall insulating film projecting into a region below the gate electrode. Further, the dummy gate and the oxide film below the dummy gate are removed in a manner to leave the side wall insulating film unremoved, followed by performing an impurity doping for adjusting the threshold value. As a result, it is possible to improve the short channel characteristics such that punch-through is unlikely to take place even if the channel length is decreased, thereby ensuring the reliability of the gate edge.

It should also be noted that an impurity doping for forming a punch-through stopper region is carried out together with the impurity doping for adjusting the threshold value in a self-aligned fashion in a region right under the extension region. As a result, it is possible to suppress the elevation of the threshold value caused by the channel stopper while effectively suppressing the short channel effect.

Embodiments of the present invention will now be described with reference to the accompanying drawings. In the following description, like members or portions are denoted by like reference numerals throughout all the drawings.

[First Embodiment]

A first embodiment of the present invention will now be described with reference to FIGS. 1, 2A to 2D, 3A, 3B, 4A to 4C, 5A and 5B. FIG. 1 is a cross sectional view showing the construction of a semiconductor device according to the first embodiment of the present invention. On the other hand, FIGS. 2A to 2D, 3A, 3B, 4A to 4C, 5A and 5B are cross sectional views collectively showing a method of manufacturing a semiconductor device according to the first embodiment of the present invention.

The construction of the semiconductor device according to the first embodiment of the present invention will now be described with reference to FIG. 1.

As shown in the drawing, a semiconductor substrate 1 made of, for example, silicon is divided by an element isolating region 2 such as an STI (Shallow Trench Isolation) so as to form element regions. The semiconductor substrate 1 is, for example, P-type. In the first embodiment of the present invention, a MOSFET of, for example, an N-type is formed in the element region. Also, source-drain regions 3 of, for example, an N-type are formed apart from each other in a surface region of the element region formed in the semiconductor substrate 1. Also formed are extension regions 6 of, for example, N-type in those portions of these source-drain regions 3 which are positioned to face each other. The structure including these N-type source-drain regions 3 and the N-type extension region 6 is called aherein later an SDE region (Source-Drain-Extension). A gate insulating film 5 made of, for example, a thermal oxide film of silicon is formed between the source and drain regions 3 in a manner to cover the surface of the semiconductor substrate 1. Also, a buried channel region 4 that is not in contact with the extension regions 6 is formed below the gate insulating film 5 so as to be positioned between the extension regions 6.

Also, a gate electrode 7 made of a metal such as W, Al, Cu, or TiN (titanium nitride) or an alloy is formed on the gate insulating film 5. Side wall insulating films 8 each formed of, for example, a silicon nitride film are formed on both side surfaces of the gate electrode 7. The width of the gate electrode 7, which is called a gate length when it comes to the construction of a transistor, is made larger than the width of the gate insulating film 5. In other words, the gate insulating film 5 is arranged substantially in the center of the gate electrode 7. When the gate insulating film 5 overlaps the gate electrode 7, a clearance in which the gate insulating film is not present is formed between the gate electrode 7 and the surface of the semiconductor substrate 1, and a projecting portion 8' of the side wall insulating film 8 is loaded in the clearance noted above. To be more specific, the side wall insulating film 8 projects into the clearance in question so as to form the projecting portion 8'. The thickness of the projecting portion 8' is larger than that of the gate insulating film 5. Both side regions on the bottom surface of the gate electrode 7 are formed on the projecting portion 8'. The projecting portion 8' is generally called a terrace type spacer.

Also, an interlayer insulating film 9 formed of, for example, a silicon oxide film is formed by, for example, a CVD method on the surface of the semiconductor substrate 1. The interlayer insulating film 9 is formed to expose the surface of the gate electrode 7 and to bury the periphery of the gate electrode 7. Further, an interlayer insulating film 10 such as a silicon oxide film is formed on the interlayer insulating film 9 and on the exposed surface of the gate electrode 7. Connection wirings 11 and 11' electrically connected to the source-drain regions 3 are formed to extend through the interlayer insulating films 9 and 10. Each of these connection wirings 11 and 11' is formed of, for example, tungsten. The connecting portions of these connection wirings 11, 11' are exposed to the outside from the surface of the interlayer insulating film 10.

The semiconductor device according to the first embodiment of the present invention comprises the projecting portion 8' of the side wall insulating film 8, which projects into the inner region relative to the side surface of the gate electrode 7, with the result that a region that is unlikely to be inverted is formed between the buried channel region 4 and the extension region 6. It follows that it is possible to suppress punch-through even if the channel length is decreased. In other words, the first embodiment of the present invention makes it possible to improve the short channel characteristics so as to ensure the reliability of the gate edge.

A method of manufacturing the semiconductor device according to the first embodiment of the present invention will now be described with reference to FIGS. 2A to 2D, 3A, 3B, 4A to 4C, 5A and 5B.

Figure 2A:
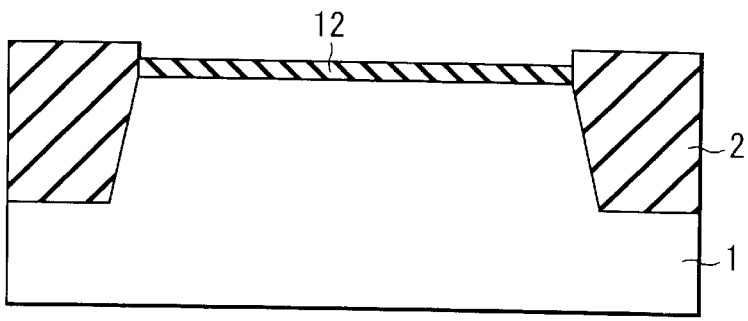

In the first step, the element separating region 2 consisting of a silicon oxide film is formed on the semiconductor substrate 1, followed by forming an insulating film 12 such as a silicon oxide film, as shown in FIG. 2A. It suffices for the thickness of the insulating film 12, which determines the height of the terrace type spacer (projecting portion) 8' described herein later, to be larger than that of the gate insulating film 5 and to be large enough to ensure sufficiently the difference in depth of the impurities doped by ion implantation. It is desirable for the insulating film 12 to be formed of a silicon thermal oxide film having a thickness falling within a range of, for example, between 5 nm and 30 nm. It is also possible for the insulating film 12 to be formed of a material that permits ensuring a suitable etching selectivity ratio between the material for forming a gate dummy pattern 14 referred to herein later and the semiconductor substrate in forming a side etching groove 15 in the subsequent step. For example, it is possible to use a silicon nitride (SiN) film for forming the insulating film 12.

Figure 2B:
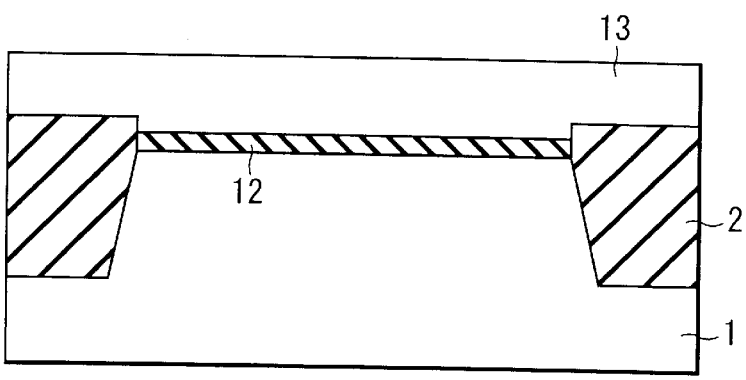

In the next step, a material for forming the gate dummy pattern 14, e.g., a polysilicon film 13, is deposited in a thickness of about 200 nm on the element separating region 2 and the insulating film 12, as shown in FIG. 2B. It is possible for the polysilicon film 13 to be replaced by a film of a material that permits ensuring a suitable etching selectivity ratio relative to the material of the neighboring member in the subsequent step of forming a groove 16 for burying the gate.

Figure 2C:
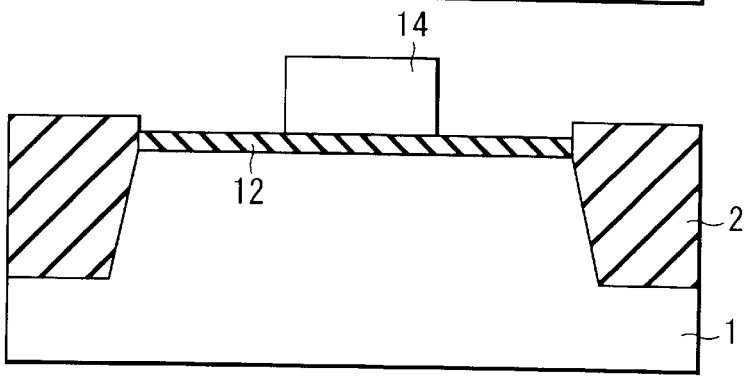

Then, the polysilicon film 13 is selectively removed by, for example, a photoresist process or a RIE (Reactive Ion Etching) process so as to form the gate dummy pattern 14, as shown in FIG. 2C. In the step of removing the polysilicon film 13, it is possible to etch partly or entirely the insulating film 12.

Figure 2D:
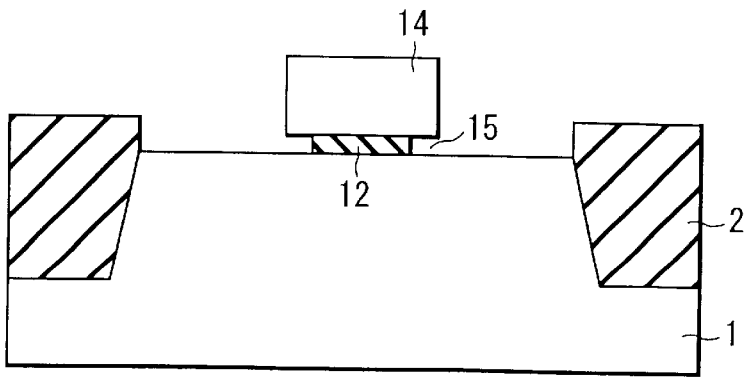

In the next step, the insulating film 12 is etched so as to form a side etching groove 15 right under the gate dummy pattern 14, as shown in FIG. 2D. Where the insulating film 12 is formed of silicon oxide, an isotropic etching which permits etching in the lateral direction, too, is performed by using an oxide film etching solution such as a hydrofluoric acid. It is possible to easily control the length in the lateral direction of the side etching groove 15 by adjusting the etching time of the insulating film 12.

Figure 3A:
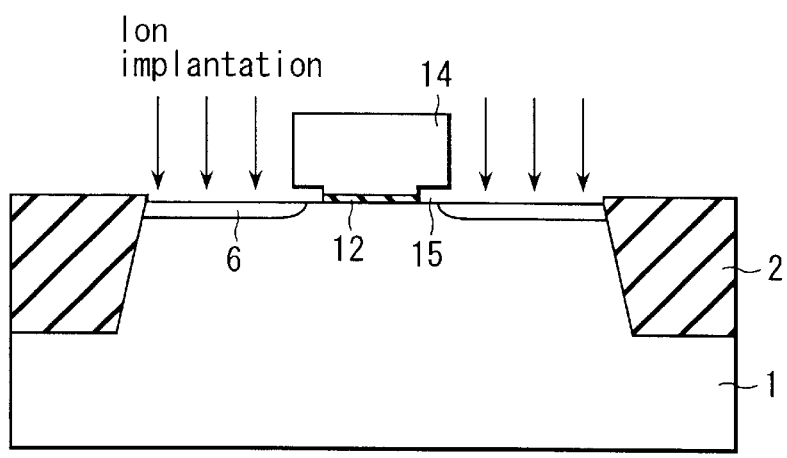
FIGS. 2A, 2B, 2C, 2D, 3A, 3B, 4A, 4B, 4C, 5A and 5B are cross sectional views collectively showing a method of manufacturing a semiconductor device according to the first embodiment of the present invention.

After formation of the side etching groove 15, an impurity for forming the extension region 6 such as phosphorus or arsenic (in the case of an N-type MOSFET) is introduced into the surface region of the semiconductor substrate 1 by means of ion implantation, so as to form the extension regions 6, as shown in FIG. 3A. In this case, it is possible to form in advance an oxide film having a thickness not so large as to bury the side etching groove 15 as a screening oxide film for ion implantation. For example, where the side etching groove 15 has a height of 10 nm, it is possible to form a screening oxide film having a thickness of about 2 nm.

Figure 3B:
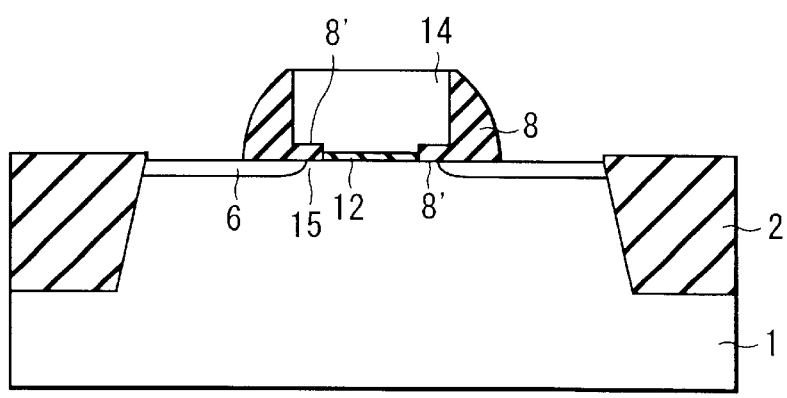

After ion implantation step, the side wall insulating films 8 are formed on the side surfaces of the gate dummy pattern 14 and within the side etching groove 15, as shown in FIG. 3B. It is appropriate to use a film capable of filling the side etching groove 15, e.g., a silicon nitride film (SiN film) formed by an LPCVD method, which is satisfactory in the step coverage, as the side wall insulating film 8. To be more specific, it is possible form a silicon nitride film or the like on the entire surface, followed by etching back the silicon nitride film by RIE (Reactive Ion Etching) so as to form the side wall insulating film 8 to the side of the gate dummy pattern 14. In this step, the silicon nitride film enters the side etching groove 15 so as to form the projecting portion 8', or a terrace type spacer, of the side wall insulating film 8.

Figure 4A:
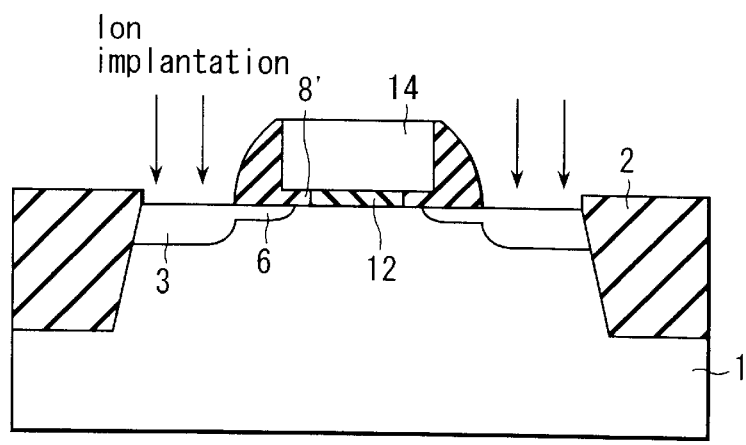

In the next step, an impurity such as phosphorus or arsenic (in the case of an N-type MOSFET) is introduced by means of ion implantation into the semiconductor substrate 1 with the gate dummy pattern 14 and the side wall insulating film 8 used as a mask, followed by performing activation under high temperatures so as to form the source-drain regions 3, as shown in FIG. 4A.

Figure 4B:
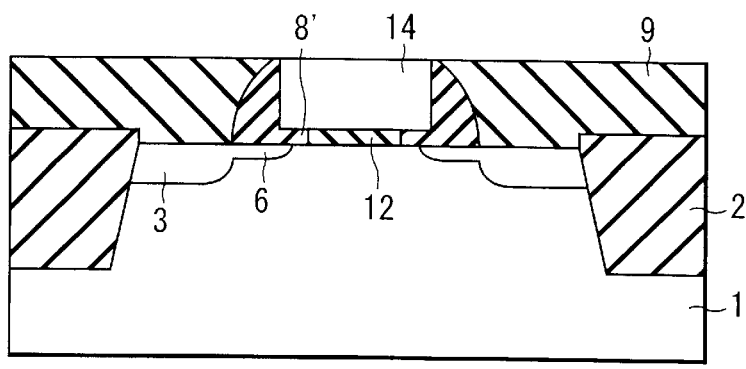

After formation of the source-drain regions 3, an interlayer insulating film 9 such as a silicon oxide film is deposited on the entire surface, followed by planarizing the surface of the interlayer insulating film 9 by, for example, CMP (Chemical Mechanical Polishing) so as to expose the surface of the gate dummy pattern 14 to the outside, as shown in FIG. 4B.

Figure 4C:
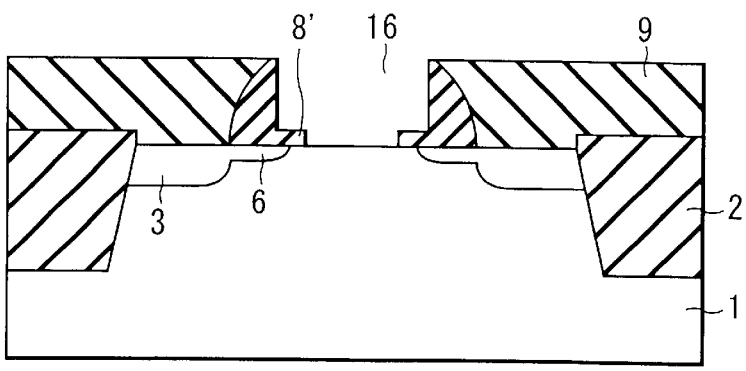

In the next step, the gate dummy pattern 14 is selectively removed so as to form a groove 16 for burying a gate, as shown in FIG. 4C. Where the gate dummy pattern 14 is formed of polysilicon, it is possible to remove selectively the gate dummy pattern 14 by CDE (Chemical Dry Etching) using an etching gas such as $CF_4$ or by using a mixed acid consisting of hydrofluoric acid and $HNO_3$. Incidentally, in the case of using the mixed acid, it is possible to control appropriately the selectivity ratio of the oxide film and polysilicon by controlling the ratio of hydrofluoric acid. Then, the insulating film 12 formed first is removed, followed by forming the terrace type spacer 8'. In this case, it is possible to remove the insulating film 12 by the treatment with hydrofluoric acid, if the side wall insulating film 8 is formed of a silicon nitride film.

Figure 5A:
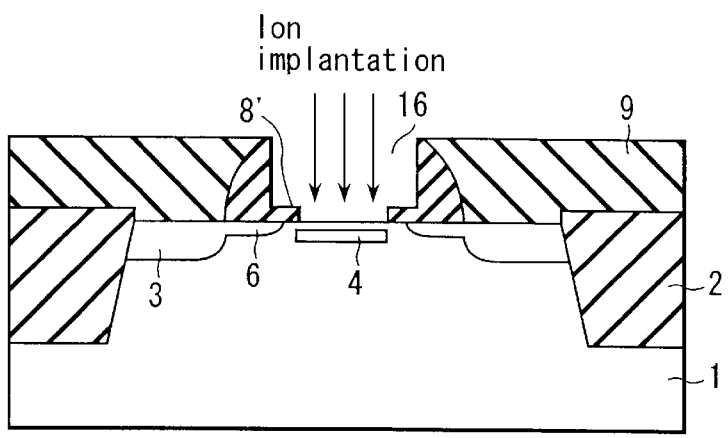

In the next step, an impurity for forming the channel region such as phosphorus or arsenic (in the case of an N-type MOSFET) is introduced by means of ion implantation into the surface region of the semiconductor substrate 1 so as to form a buried channel region 4, as shown in FIG. 5A. In this step, it is possible to dope the impurity in only the semiconductor substrate 1 alone present in a specified region within the groove 16 for burying the gate by controlling the accelerating energy for ion implantation. For example, in the case of forming the buried channel region 4 of a damascene metal gate, the impurity for the punch-through stopper is introduced deep and the impurity for forming the buried channel region is introduced shallow by ion implantation.

Figure 5B:
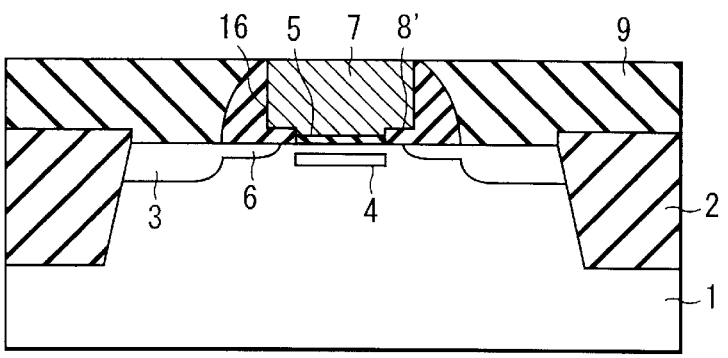

In the next step, a gate insulating film 5 and a gate electrode 7 are formed within the groove 16 for burying the gate, as shown in FIG. 5B. In the case of using the gate insulating film 5 formed of a thermal oxide film, the gate oxide film 5 is formed shallower than the terrace type spacer 8'. For example, the gate insulating film 5 is formed to a thickness suitable for maintaining the step of the terrace type spacer 8'. Also, in the case of a damascene metal gate structure, a laminate structure consisting of a TiN layer and a W layer is formed, followed by planarizing the surface of the laminate structure by, for example, CMP so as to form the gate electrode 7. It is also possible to perform the doping of an impurity by using polysilicon as a material of the gate electrode.

Finally, after formation of the gate electrode 7, an insulating film 10 is superposed on the insulating film 9, followed by forming contact holes extending through the insulating films 10 and 9 so as to form the connection wires 11, 11' connected to the source-drain regions 3, as shown in FIG. 1.

In the method of manufacturing a semiconductor device according to the first embodiment of the present invention, the side wall insulating film 8 such as a silicon nitride film is buried in the sided etching groove 15 so as to form the projecting portion 8' of the side wall insulating film 8 extending into a region below the gate dummy pattern 14, followed by removing the gate dummy pattern 14 and the oxide film 12 positioned below the gate dummy pattern 14. Further, the side wall insulating film 8 is left unremoved, and the impurity doping for controlling the threshold value is performed. As a result, it is possible to improve the short channel characteristics such that the punch-through is rendered difficult even if the channel length is decreased so as to ensure the reliability of the gate edge.

[Second Embodiment]

Figure 6:
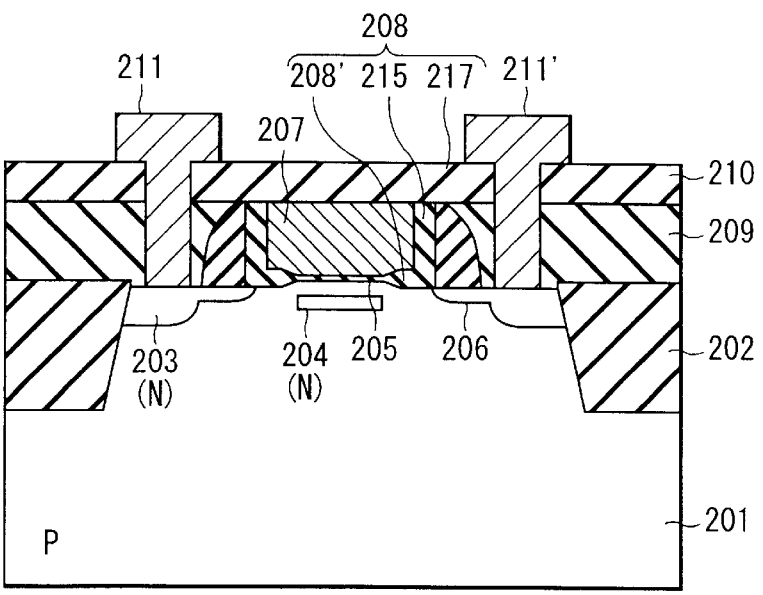
FIG. 6 is a cross sectional view showing the construction of a semiconductor device according to a second embodiment of the present invention.

A second embodiment of the present invention will now be described with reference to FIGS. 6, 7A to 7C, 8A to 8C, 9A, 9B, 10A and 10B. FIG. 6 is a cross sectional view showing the construction of the semiconductor device according to the second embodiment of the present invention. On the other hand, FIGS. 7A to 7C, 8A to 8C, 9A, 9B, 10A and 10B are cross sectional views collectively showing the method of manufacturing the semiconductor device according to the second embodiment of the present invention.

First of all, the construction of the semiconductor device according to the second embodiment of the present invention will now be described with reference to FIG. 6.

As shown in the drawing, an element region separated by an element separating region 102 such as an STI is formed in, for example, a P-type semiconductor substrate 201 consisting of, for example, silicon. N-type source-drain regions 203 having N-type extension regions 206 formed in those portions of the source-drain regions 203 which are positioned to face each other (SDE region) are formed apart from each other in the surface region of the element region included in the semiconductor substrate 201. A gate insulating film 205 consisting of, for example, a thermal oxide film of silicon is formed to cover the surface of that portion of the semiconductor substrate 201 which is positioned between the source-drain regions 203. Also, a buried channel region 204, which is not in contact with the extension regions 206, is formed between the extension regions 206 below the gate insulating film 205.

Also, a gate electrode 207 made of a metal such as W, Al, Cu or TiN or an alloy is formed on the gate insulating film 205. Side wall insulating films 208 are formed on both side surfaces of the gate electrode 207. The side wall insulating film 208 includes a first portion 215 in contact with the gate electrode 207, a second portion 217 covering the outer surface of the first portion 215, and a projecting portion 208' positioned right under the gate electrode 207 and formed in the both side regions of the gate insulating film 205. The projecting portion 208', which is formed by heating the gate insulating film 205, is formed thicker than the gate insulating film 205.

The width (gate length) of the gate electrode 207 is larger than the width of the gate insulating film 205 excluding the projecting portion 208'. To be more specific, the gate insulating film 205 is arranged substantially in the center of the gate electrode 207 such that, when the gate insulating film 205 overlaps with the gate electrode 207, the projecting portions 208' are formed between the both side portions of the gate electrode 207 and the surface of the semiconductor substrate 201. In other words, both side regions on the bottom surface of the gate electrode 207 are formed on the projecting portion 208'. The projecting portion 208' is generally called a terrace type spacer.

An interlayer insulating film 209 such as a silicon oxide film is formed by, for example, a CVD method on the semiconductor substrate 201. The interlayer insulating film 209 is formed to expose the surface of the gate electrode 207 to the outside and to bury the periphery of the gate electrode 207. Further, an interlayer insulating film 210 such as a silicon oxide film is formed to cover the surface of the interlayer insulating film 209 and the exposed surface of the gate electrode 207. It should be noted that connection wirings 211, 211' electrically connected to the source-drain regions 203 are formed to extend through the interlayer insulating films 209 and 210. Each of these connection wirings 211 and 211' is formed of, for example, tungsten, and the connecting portions of these connection wirings 211, 211' are exposed to the outside from the surface of the interlayer insulating film 210.

The semiconductor device according to the second embodiment of the present invention includes the first portion 215 of the side wall insulating film 208 formed on the side surface of the gate electrode 207 and the projecting portion 208' formed on both side regions of the gate insulating film 205 so as to form a region that is unlikely to be inverted between the buried channel region 204 and the extension region 206. As a result, punch-through is rendered difficult even if the channel length is decreased. It follows that the second embodiment of the present invention makes it possible to improve the short channel characteristics so as to ensure the reliability of the gate edge.

A method of manufacturing the semiconductor device according to the second embodiment of the present invention will now be described with reference to FIGS. 7A to 7C, 8A to 8C, 9A, 9B, 10A and 10B.

Figure 7A:
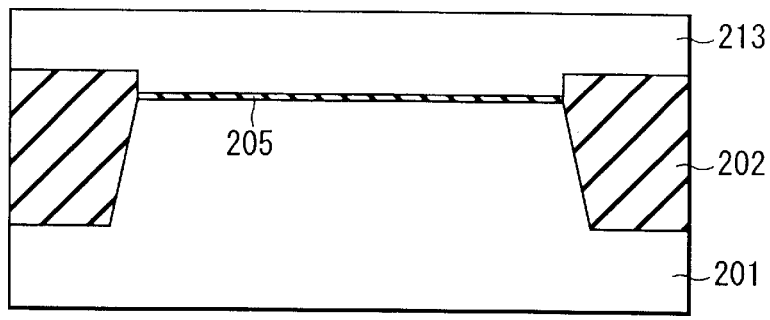
FIGS. 7A, 7B, 7C, 8A, 8B, 8C, 9A, 9B, 10A and 10B are cross sectional views collectively showing a method of manufacturing a semiconductor device according to the second embodiment of the present invention.

In the first step, an element separating region 202 such as an STI is formed on the semiconductor substrate 201, followed by forming a gate insulating film 205 such as a silicon oxide film in the element region, as shown in FIG. 7A. Then, the material of the gate dummy pattern 214, such as polysilicon is deposited to a thickness of about 200 nm to form the film 213 on the gate insulating film 205 and the element separating region 202.

Figure 7B:
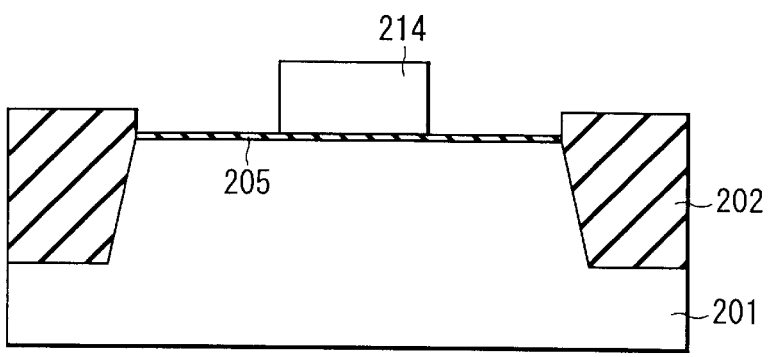
Figure 7C:
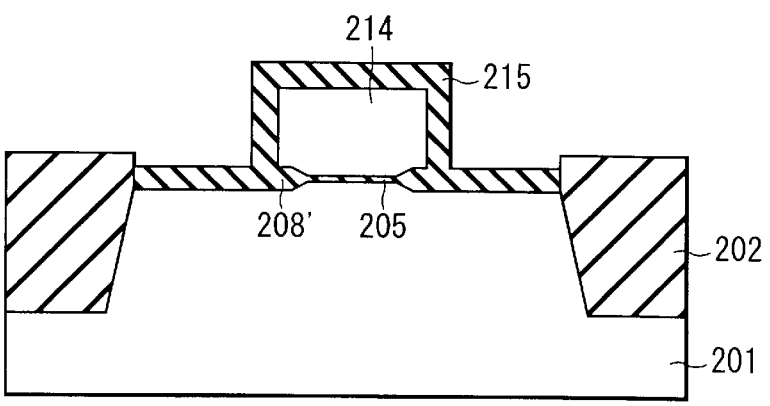

In the next step, the polysilicon film 213 is patterned through a photoresist forming step, RIE step, etc. so as to form a gate dummy pattern 214, as shown in FIG. 7B. Further, the surfaces of the semiconductor substrate 201 and the gate dummy pattern 214 are thermally oxidized so as to form a post-oxide film 215 on the surface of the gate dummy pattern 214, as shown in FIG. 7C. In this step, a bird's beak region is formed in the edge portion on the bottom surface of the gate dummy pattern 214 so as to form a terrace type spacer (projecting portion) 208.

Figure 8A:
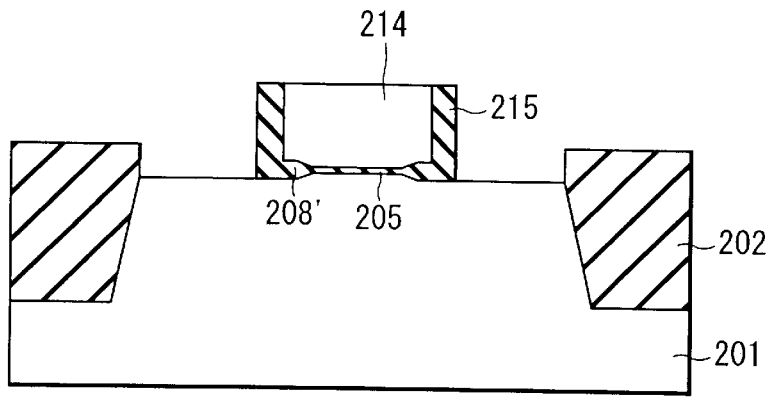
Figure 8B:
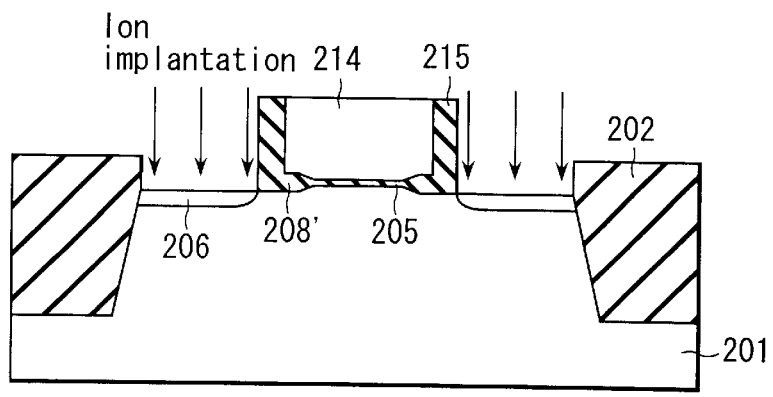

In the next step, RIE is applied to the post-oxide film 215 so as to have the side surface of the gate dummy pattern 214 and the portion of the terrace type spacer 208' left unremoved, as shown in FIG. 8A. Then, an N-type impurity such as phosphorus or arsenic is introduced in the case of an N-type MOSFET into the semiconductor substrate 201 by means of ion implantation with the gate dummy pattern 214 used as a mask so as to form extension regions 206.

Further, an insulating film 217 such as a silicon nitride film (SiN film) is formed on the side surface of the post-oxide film 215 in the gate dummy pattern 214. As a result, formed is a side wall insulating film 208 consisting of the post-oxide film 215, the insulating film 217 and the projecting portion 208'. The insulating film 217 is formed as follows. Specifically, a silicon nitride film or the like is formed on the entire surface of the substrate, followed by etching back the silicon nitride film by RIE so as to form the side wall structure to the side of the post-oxide film 215.

Figure 8C:
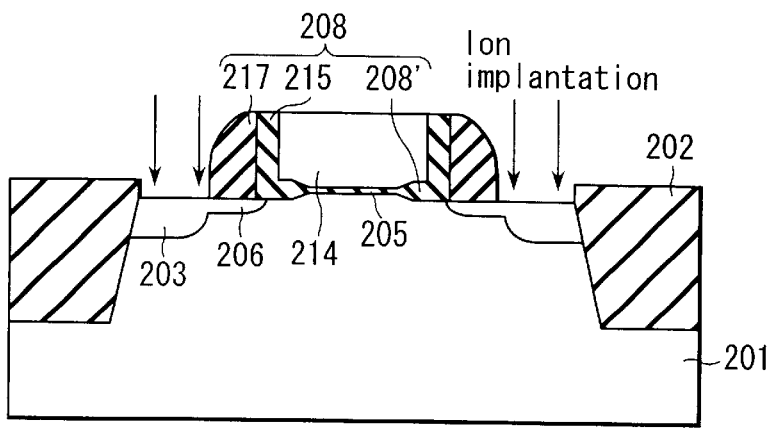
Figure 9A:
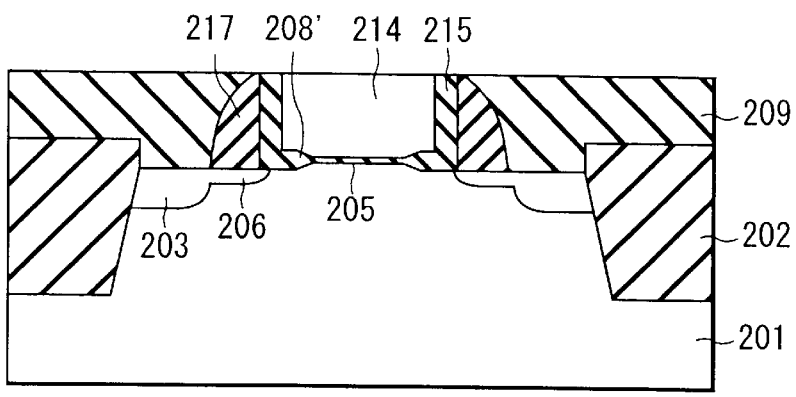

In the next step, an N-type impurity such as phosphorus or arsenic is introduced by means of ion implantation in the case of an N-type MOSFET with the gate dummy pattern 214 and the side wall insulating film 208 used as a mask, followed by applying an activation treatment under high temperatures so as to form source-drain regions 203 connected to the extension regions 206, as shown in FIG. 8C. After formation of the source-drain region 203, an interlayer insulating film 209 such as a silicon oxide film is deposited, followed by planarizing the surface of the interlayer insulating film by, for example, CMP so as to expose the surface of the gate dummy pattern 214, as shown in FIG. 9A.

Figure 9B:
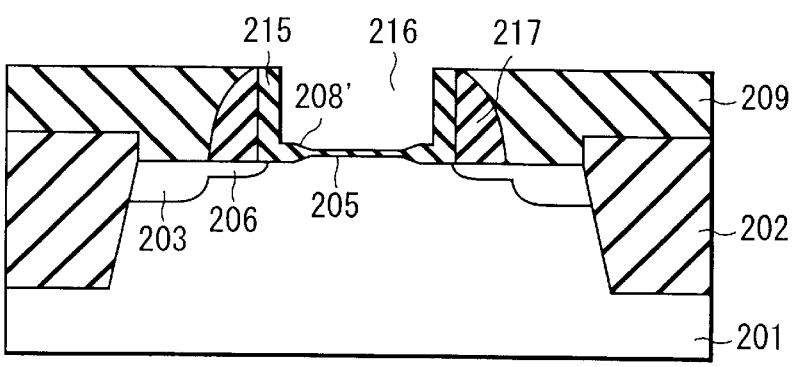
Figure 10A:
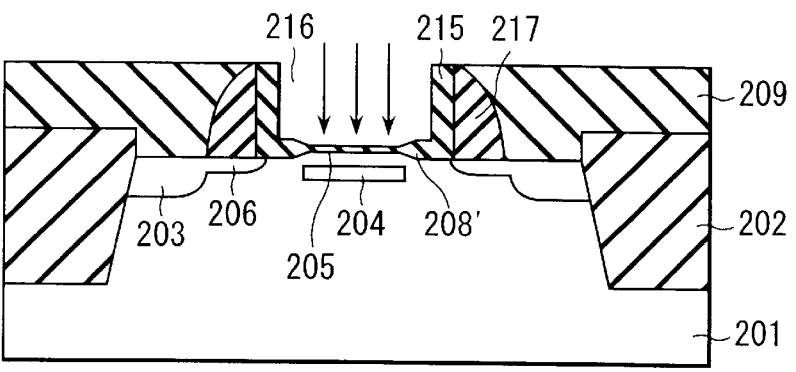

Then, the gate dummy pattern 214 is selectively removed by etching so as to form a groove 216 for burying a gate, as shown in FIG. 9B. Further, an N-type impurity such as arsenic or phosphorus is introduced by means of ion implantation so as to form a buried channel region 204, as shown in FIG. 10A. In this case, it is possible to dope the impurity in only a specified region of the semiconductor substrate 201 within the groove 216 for burying the gate by controlling the accelerating energy in ion implantation step.

Figure 10B:
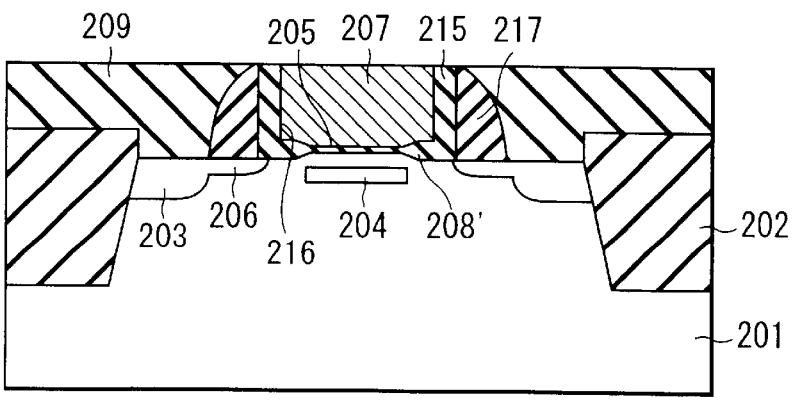

Further, a gate electrode 207 is formed on the gate insulating film 205 within the groove 216 for burying the gate, as shown in FIG. 10B. In this case, it is possible to use the oxide film 205 formed below the gate dummy pattern 214 as the gate insulating film 205 as in this second embodiment. It is also possible to form again the gate insulating film 205 by once peeling off the screening oxide film used in ion implantation step. In the case of forming again the gate insulating film 205, the damage or the influence of contamination or the like are unlikely to remain.

Also, in the case of a damascene metal gate structure, the gate electrode 207 is formed by forming a laminate structure consisting of a TiN layer and a W layer, followed by planarizing the surface of the laminate structure by, for example, CMP. It is also possible to perform an impurity doping by the same process by using polysilicon as a material of the gate electrode.

Finally, an insulating film 210 is superposed on the insulating film 209, followed by forming the connection wirings 211 and 211' connected to the source-drain regions 203 by forming contact holes extending through the insulating films 209 and 210 so as to obtain a desired transistor as shown in FIG. 6.

According to the second embodiment of the present invention described above, the thermal oxide film 215 is formed on the side surface of the gate electrode 207, and the projecting portions 208' are formed on both side regions of the gate insulating film 205. As a result, formed is a region that is unlikely to be inverted between the buried channel region 204 and the extension region 206. It follows that punch-through is unlikely to take place even if the channel length is decreased. In this fashion, the second embodiment of the present invention makes it possible to improve the short channel characteristics so as to ensure the reliability of the gate edge.

Further, in the case where the gate insulating film 205 is formed of an oxide film, it is possible to increase appropriately the thickness of the edge portion (projecting portion 208') of the gate insulating film 205 so as to make it possible to expect improvements in the gate breakdown voltage and the reliability.

FIGS. 11 to 13 are cross sectional views of semiconductor substrates used in the prior art and the first and second embodiments of the present invention for describing the functions and effects produced by the first and second embodiments of the present invention. The functions and effects of the present invention will now be described in comparison with the prior art with the semiconductor device according to the first embodiment of the present invention taken as an example.

Figure 11A:
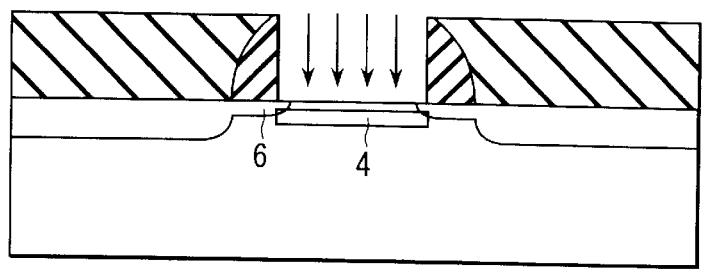
FIG. 11A is a cross sectional view showing the construction of a conventional semiconductor substrate, which is used for describing the function and effect produced by the semiconductor device according to each of the first and second embodiments of the present invention.

In the semiconductor device of the conventional structure shown in FIG. 11A, the counter ion implantation region (buried channel region 4) is in contact with the extension region 6. In other words, the impurity regions of the same conductivity type are joined to each other, with the result that punch-through tends to take place easily.

Figure 11B:
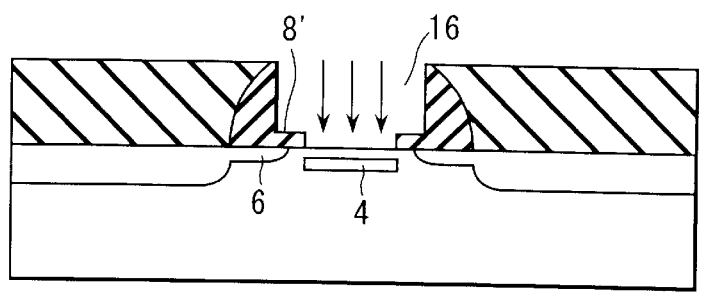
FIG. 11B is a cross sectional view showing the construction of a semiconductor substrate used in each of the first and second embodiments of the present invention, which is used for describing the function and effect produced by the semiconductor device according to each of the first and second embodiments of the present invention.

On the other hand, in the structure according to the first embodiment of the present invention, the thick terrace type spacer 8' (projecting portion of the side wall insulating film) is present in both edge portions of the groove 16 for performing channel ion implantation as shown in FIG. 11B (corresponding to the semiconductor device shown in FIG. 1). It follows that it is possible to form the counter ion implantation region (buried channel region 4), apart from the extension region 6. Because of this particular construction, a region that is unlikely to be inverted is formed between the buried channel region 4 and the extension region 6, with the result that punch-through is unlikely to take place even if the channel length is decreased.

Figure 12A:
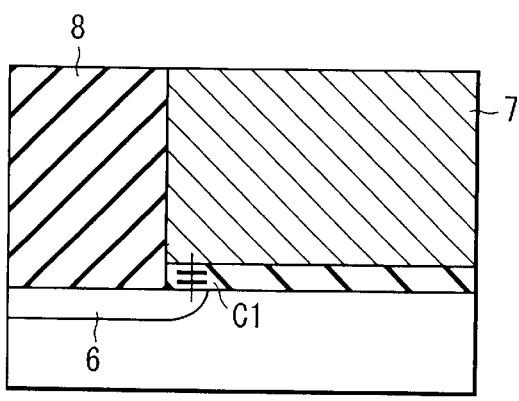
FIG. 12A is a cross sectional view showing the construction of a conventional semiconductor substrate, which is used for describing the function and effect produced by the semiconductor device according to each of the first and second embodiments of the present invention.

Also, in the semiconductor device of the conventional structure as shown in FIG. 12A, an overlapping capacitance C1 is increased in the overlapping portion between the diffusion portion of the extension region 6 in the lateral direction into a region below the gate electrode 7 and the gate electrode 7.

Figure 12B:
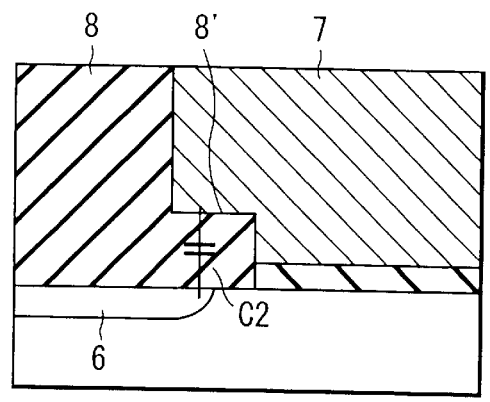
FIG. 12B is a cross sectional view showing the construction of a semiconductor substrate used in each of the first and second embodiments of the present invention, which is used for describing the function and effect produced by the semiconductor device according to each of the first and second embodiments of the present invention.

On the other hand, in the construction according to the first embodiment of the present invention, it is possible to form thick the insulating film (projecting portion 8') in the overlapping portion of the gate electrode 7, as shown in FIG. 12B, so as to make it possible to decrease the overlapping capacitance C2, thereby improving the transistor characteristics.

Figure 13A:
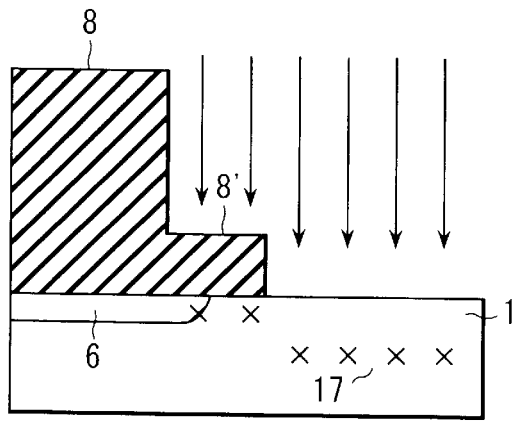
FIGS. 13A, 13B and 13C are cross sectional views showing the construction of a semiconductor substrate used in each of the prior art and the first and second embodiments of the present invention, which are used for describing the function and effect produced by the semiconductor device according to each of the first and second embodiments of the present invention.
Figure 13B:
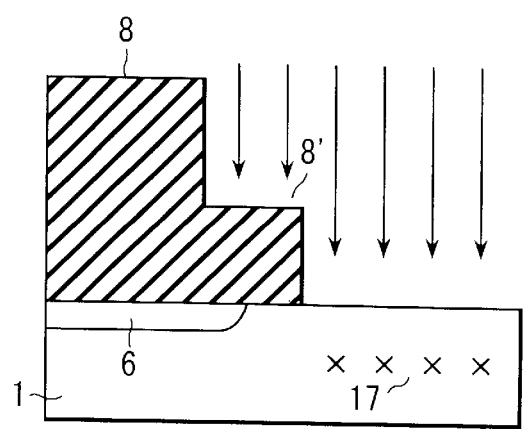

It should also be noted that it is possible to control optionally the height and the length in the lateral direction of the terrace type spacer (projecting portion of the side wall insulating film) 8' in both edges of the region where a channel is to be formed by employing the process according to the first embodiment of the present invention in the process of forming a damascene gate transistor. In other words, it is possible to control the height and the length in the lateral direction of the terrace type spacer (projecting portion) 8' by controlling the thickness of the insulating film 12, such as the silicon oxide film shown in FIG. 2A, and by controlling the size of the side etching groove 15 shown in FIG. 2D through adjustment of the etching amount. As a result, a difference in the formation of the impurity region is generated between the case where the terrace type spacer 8' is thin and the case where the terrace type spacer 8' is thick even if ion implantation of the same energy is carried out. To be more specific, where the terrace type spacer 8' is thin, the impurity is doped in the semiconductor substrate 1 below the terrace type spacer 8', as shown in FIG. 13A. On the other hand, where the terrace type spacer 8' is thick, an impurity 17 is shielded by the terrace type spacer 8' so as to prevent the impurity 17 from being doped in the semiconductor substrate 1 below the terrace type spacer 8', as shown in FIG. 13B.

Also, in the case of forming the punch-through stopper region, the thickness of the terrace type spacer (projecting portion) 8' is set at, for example, 10 nm in the step of introducing a channel impurity 17' for the buried channel region of an n-MOS transistor by means of ion implantation. At this time, a stopper impurity (e.g., boron) 17 for forming the punch-through stopper region is introduced by means of ion implantation under an accelerating energy of 20 KeV. In this case, the stopper impurity 17 is formed shallow below the terrace type spacer 8' and is formed deep below the channel region on which the terrace type spacer 8' is not formed, as shown in FIG. 13C.

Figure 13C:
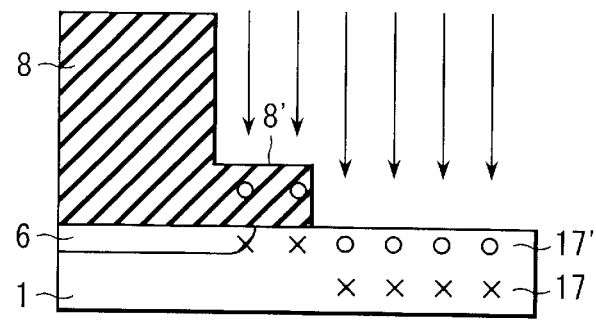

Also, in the case of introducing a channel impurity (e.g., arsenic As) 17' for forming a buried channel region by means of ion implantation under an accelerating energy of 5 KeV, the impurity 17' does not enter the semiconductor substrate 1 below the terrace type spacer 8', and the impurity distribution including the impurity 17' is formed in the channel region on which the terrace type spacer 8' is not formed, as shown in FIG. 13C. In the case of the particular construction (i.e., in the construction including the buried channel region 4 shown in FIG. 1), it is possible to realize a construction in which the impurity concentration of the conductivity type equal to that in the semiconductor substrate 1 is high and the buried region concentration is low in the edge portion on the surface of the channel region and that the impurity concentration of the conductivity type equal to that in the semiconductor substrate 1 is low and the buried region concentration is high in the central portion on the surface of the channel. In other words, it is possible to produce an effect similar to that produced by a Halo structure without increasing the parasitic capacitance between the extension region 6 and the semiconductor substrate or between the source-drain regions 3 and the semiconductor substrate.

As described above, it is possible to control the distance between the extension region 6 and the buried channel region 4 by adjusting the length of the terrace type spacer 8'. In other words, in the second embodiment of the present invention, it is possible to control the degree of punch-through in conformity with the impurity concentration and distribution in the channel and the desired channel length so as to increase the degree of freedom for optimizing the element characteristics.

Also, it is possible to improve the controllability in terms of the overlapping capacitance between the gate electrode 7 and the extension region 6 or between the gate electrode 7 and the source-drain regions 3, the junction capacitance between the channel region and the extension region 6 or between the channel region and the source-drain regions, the effective gate length, and the channel profile in the lateral direction so as to increase the degree of freedom in the design of the channel.

[Third Embodiment]

Figure 14:
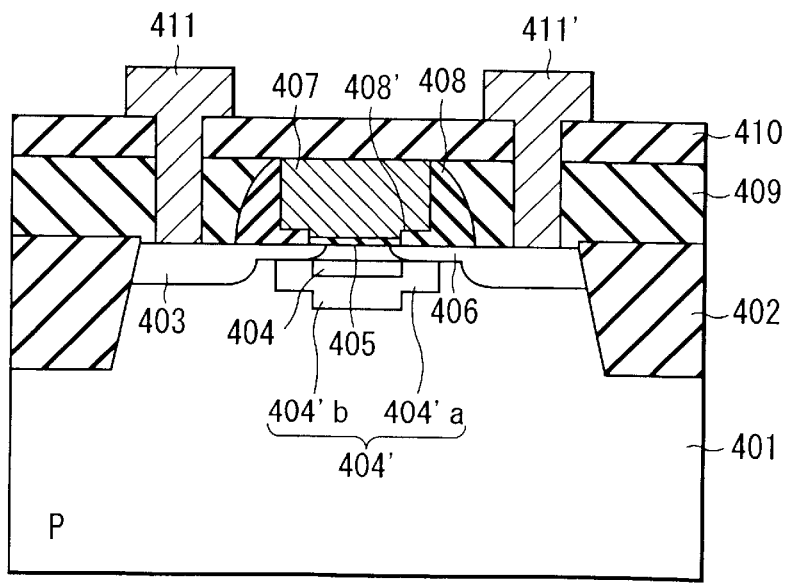
FIG. 14 is a cross sectional view showing the construction of a semiconductor device according to a third embodiment of the present invention.

A third embodiment of the present invention will now be described with reference to FIGS. 14, 15A to 15C, 16A to 16C, 17A to 17C, 18A and 18B. FIG. 14 is a cross sectional view showing the construction of the semiconductor device according to the third embodiment of the present invention. On the other hand, FIGS. 15A to 15C, 16A to 16C, 17A to 17C, 18A and 18B are cross sectional views collectively showing the method of manufacturing the semiconductor device according to the third embodiment of the present invention.

First of all, the construction of the semiconductor device according to the third embodiment of the present invention will now be described with reference to FIG. 14.

As shown in the drawing, an element region separated by an element separating region 402 such as an STI is formed in, for example, a P-type semiconductor substrate 401 consisting of, for example, silicon. N-type source-drain regions 403 having N-type extension regions 406 formed in those portions of the source-drain regions 403 which are positioned to face each other (SDE region) are formed apart from each other in the surface region of the element region included in the semiconductor substrate 401. A gate insulating film 405 consisting of, for example, a thermal oxide film of silicon is formed to cover the surface of that portion of the semiconductor substrate 401 which is positioned between the source-drain regions 403.

Also, a gate electrode 407 made of a metal such as W, Al, Cu or TiN or an alloy is formed on the gate insulating film 405. Side wall insulating films 408 are formed on both surfaces of the gate electrode 407. It should be noted that the width (gate length) of the gate electrode 407 is larger than the width of the gate insulating film 405. In other words, when the gate insulating film 405 is arranged substantially in the center of the gate electrode 407 so as to allow the gate insulating film 405 and the gate electrode 407 to overlap each other, a clearance in which the gate insulating film is not present is formed between the gate electrode 407 and the semiconductor substrate 401. A projecting portion 408' projecting from the side wall insulating film 408 is loaded in the clearance noted above. The projecting portion 408' is formed thicker than the gate insulating film. Further, both side edge regions on the bottom surface of the gate electrode 407 are positioned on the projecting portion 408'. The projecting portion 408' of this particular construction is called a terrace type spacer.

Also, a buried channel region 404 is formed below the gate insulating film 405 between the extension regions 406. The buried channel region 404 is not in contact with either the extension region 406 or the gate insulating film 405. Also, a punch-through stopper region 404' is formed below the buried channel region 404. It should be noted that, in the punch-through stopper region 404', the peak concentration in a first portion 404'a, positioned below the projecting portion 408', is lower than the peak concentration in a second portion 404'b positioned below the buried channel region 404.

Also, an interlayer insulating film 409 such as a silicon oxide film is formed on the semiconductor substrate 401 by, for example, a CVD method. The interlayer insulating film 409 exposes the surface of the gate electrode 407 and buries the periphery of the gate electrode 407. Further, an interlayer insulating film 410 such as a silicon oxide film is formed to cover the surface of the interlayer insulating film 409 and the exposed surface of the gate electrode 407. Still further, connection wirings 411 and 411' electrically connected to the source-drain regions 403 are formed to extend through the interlayer insulating films 409 and 410. Each of these connection wirings 411 and 411' is formed of, for example, tungsten. Also, the connecting portions of these connection wirings 411, 411' are exposed to the surface of the interlayer insulating film 410.

The semiconductor device according to the third embodiment of the present invention described above includes the projecting portion 408' of the side wall insulating film 408 projecting inward relative to the side surface of the gate electrode 407, with the result that a region that is unlikely to be inverted is formed between the buried channel region 404 and the extension region 406. It follows that punch-through is unlikely to take place even if the channel length is decreased. In other words, the third embodiment of the present invention makes it possible to improve the short channel characteristics so as to ensure a reliability of the gate edge.

It should also be noted that the punch-through stopper region 404' is formed in a self-aligned fashion right under the extension region 406 so as to make it possible to control the elevation of the threshold value owing to the channel stopper while effectively suppressing the short channel effect.

A method of manufacturing a semiconductor device according to the third embodiment of the present invention will now be described with reference to FIGS. 15A to 15C, 16A to 16C, 17A to 17C, 18A and 18B.

Figure 15A:
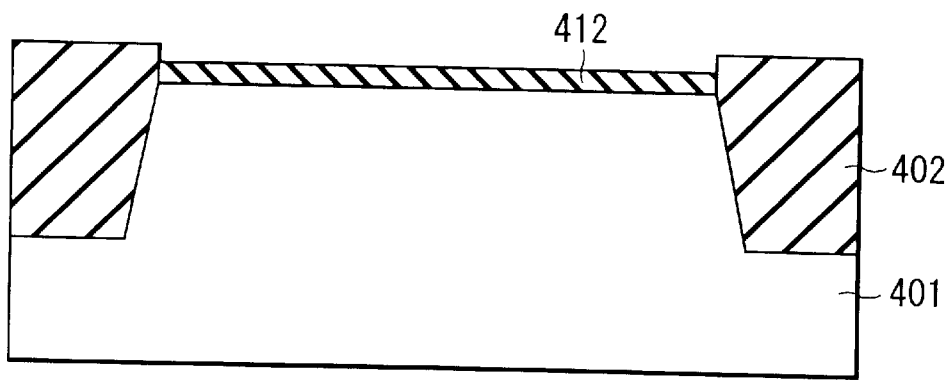
FIGS. 15A, 15B, 15C, 16A, 16B, 16C, 17A, 17B, 17C, 18A and 18B are cross sectional views collectively showing a method of manufacturing a semiconductor device according to the third embodiment of the present invention.

In the first step, an element separating region 402 such as an STI is formed on the semiconductor substrate 401, followed by forming an insulating film 412 such as a silicon oxide film in the element region, as shown in FIG. 15A. It suffices for the thickness of the insulating film 412, which determines the height of a terrace type spacer (projecting portion) 408' referred to herein later, to be larger than that of the gate insulating film and to be large enough to ensure sufficiently the difference in the depth of the impurity doped in ion implantation step. It is desirable for the insulating film 412 to be formed of a silicon thermal oxide film having a thickness of, for example, between 5 nm and 30 nm. Also, it suffices for the insulating film 412 to be capable of ensuring an etching selectivity ratio between the material of a gate dummy pattern 414 referred to herein later and the semiconductor substrate in the subsequent step of forming a side etching groove 415. In this sense, it is possible to use, for example, a silicon nitride film (SiN film) as the insulating film 412.

Figure 15B:
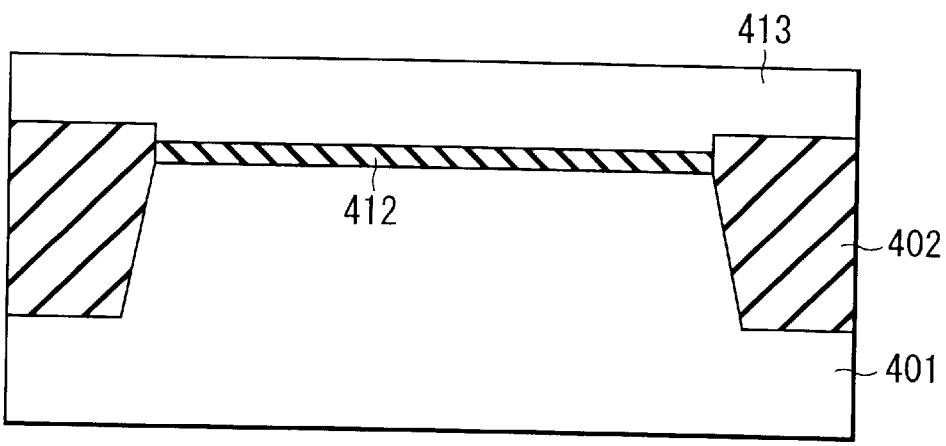

In the next step, a material used for forming the gate dummy pattern 414, e.g., a polysilicon film 413, is deposited to a thickness of about 200 nm on the element separating region 402 and the insulating film 412, as shown in FIG. 15B. It is also possible to use, in place of the polysilicon film 413, a film of a material capable of ensuring an etching selectivity ratio relative to the material of the neighboring member in the subsequent step of forming a groove 416 for burying the gate.

Figure 15C:
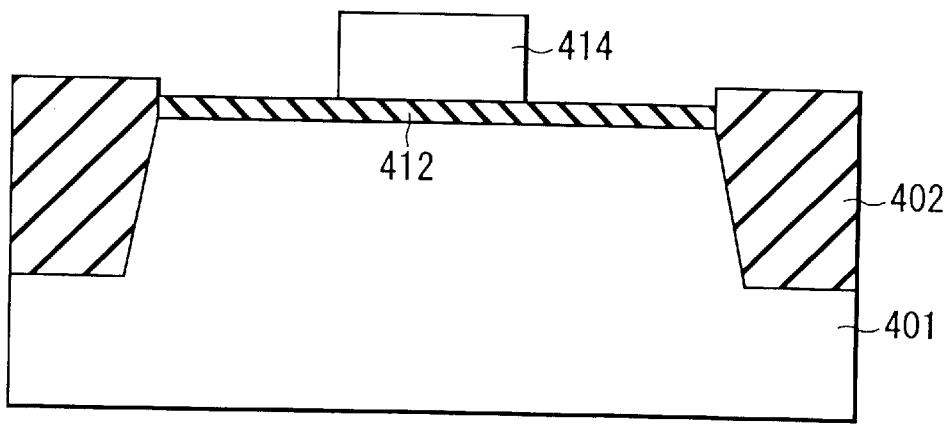

In the next step, the polysilicon film 413 is selectively removed by, for example, a photoresist process or a RIE process so as to form the gate dummy pattern 414, as shown in FIG. 15C. In this step, it is possible to remove partly or entirely the insulating film 412 by the etching simultaneously with the selective removal of the polysilicon film 413.

Figure 16A:
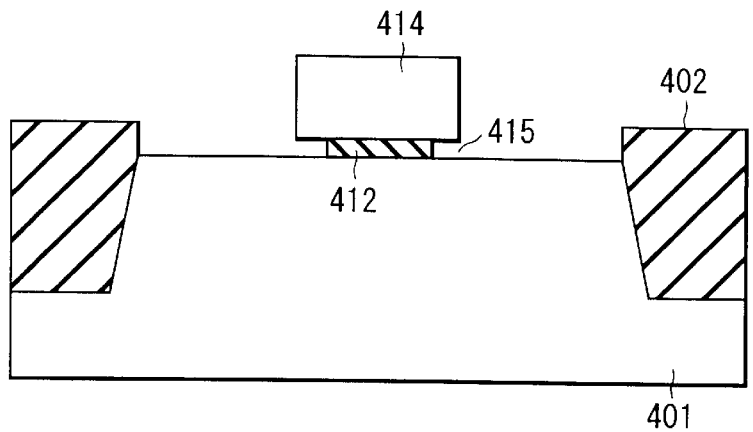
Figure 16B:
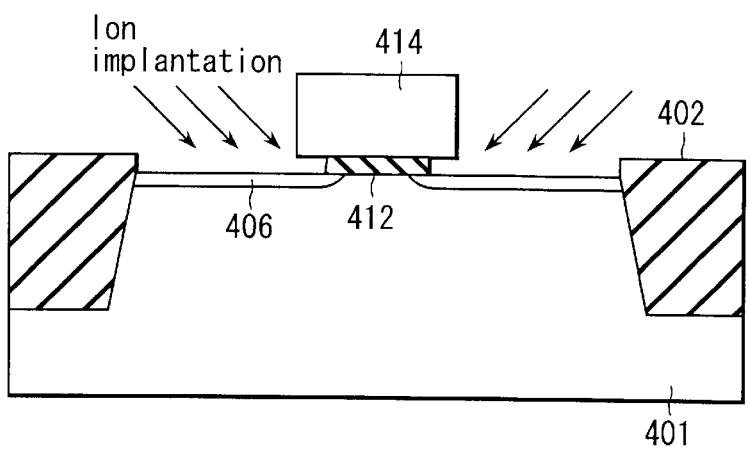

Then, the insulating film 412 is etched so as to form a side etching groove 415 right under the gate dummy pattern 414 as shown in FIG. 16A. Where the insulating film 412 is formed of silicon oxide, the insulating film 412 is subjected to an isotropic etching, which also permits the etching in the lateral direction, using an oxide film etching solution such as hydrofluoric acid. It is possible to control easily the length in the lateral direction of the side etching groove 415 by adjusting the etching time of the insulating film 412.

In the next step, an impurity such as phosphorus or arsenic for forming an extension region 406 (in the case of an N-type MOSFET) is introduced into the semiconductor substrate 401 by means of ion implantation with the gate dummy pattern 414 used as a mask so as to form extension regions 406. In this case, it is possible to form in advance an oxide film having such a thickness as not to bury the side etching groove 415 as a screening oxide film for ion implantation. For example, where the side etching groove 415 has a height of 10 nm, it is possible to form an oxide film having a thickness of about 2 nm.

Figure 16C:
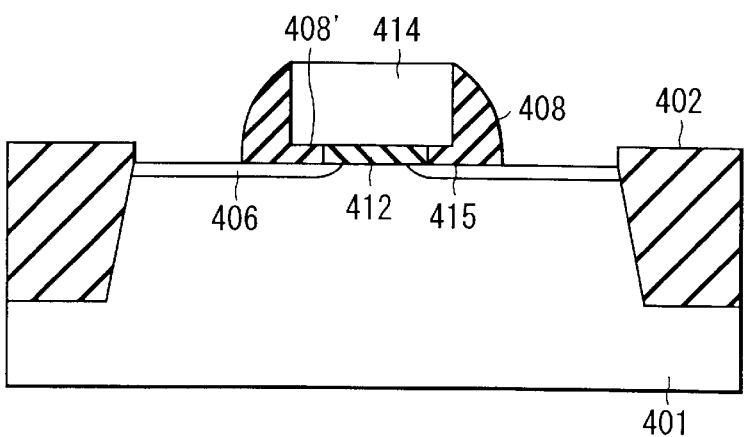

In the next step, a side wall insulating film 408 is formed on each of the gate dummy pattern 414 and within the side etching groove 415 as shown in FIG. 16C. It is desirable for the side wall insulating film 408 to be formed of a material that can be used for filling the side etching groove 415, e.g., a silicon nitride film (SiN film) formed by an LPCVD method, which is satisfactory in the step coverage. It suffices to form the side wall insulating film 408 sideward of the gate dummy pattern 414 by depositing, for example, a silicon nitride film on the entire surface, followed by etching back the silicon nitride film thus formed. In this step, the silicon nitride film extends to enter the side etching groove 415 so as to form a projecting portion (terrace type spacer) 408' of the side wall insulating film 408.

Figure 17A:
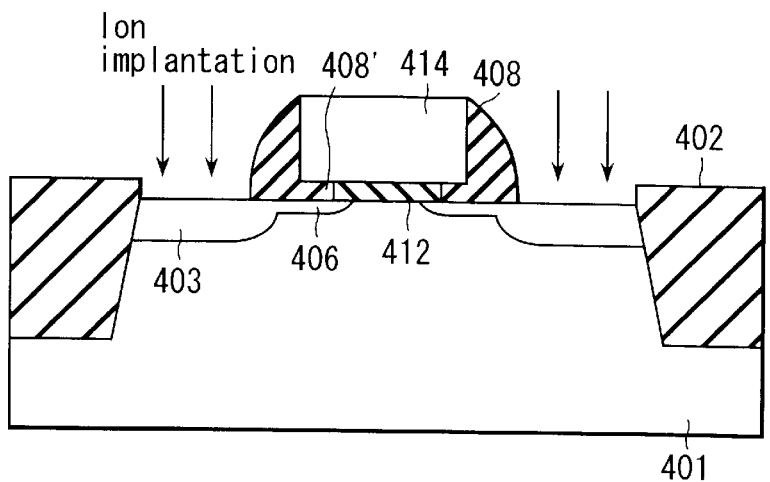
Figure 17B:
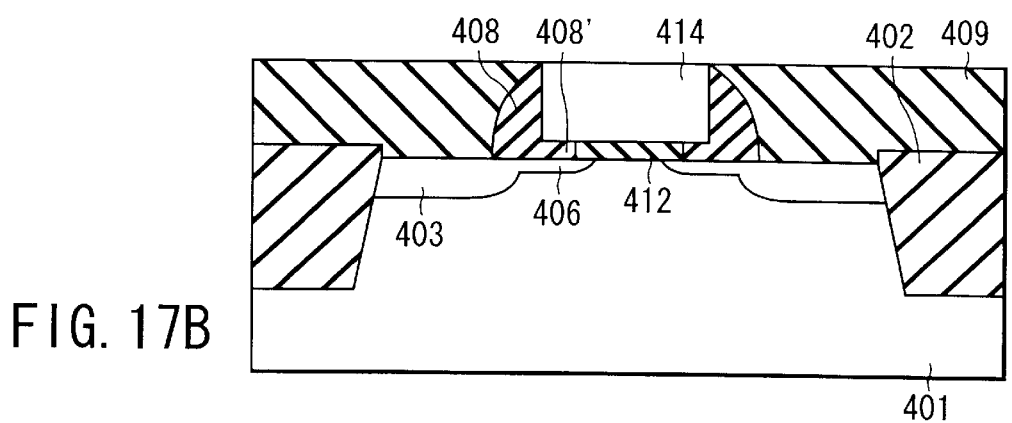

Then, in the case of an N-type MOSFET, an impurity such as phosphorus or arsenic is introduced into the semiconductor substrate 401 by ion implantation with the gate dummy pattern 414 and the side wall insulating film 408 used as a mask, followed by performing an activating treatment under a high temperature so as to form source-drain regions 403, as shown in FIG. 17A. After formation of the source-drain regions 403, an interlayer insulating film 409 such as a silicon oxide film is deposited, followed by planarizing the surface of the interlayer insulating film 409 by, for example, CMP so as to expose the surface of the dummy gate pattern 414, as shown in FIG. 17B.

Figure 17C:
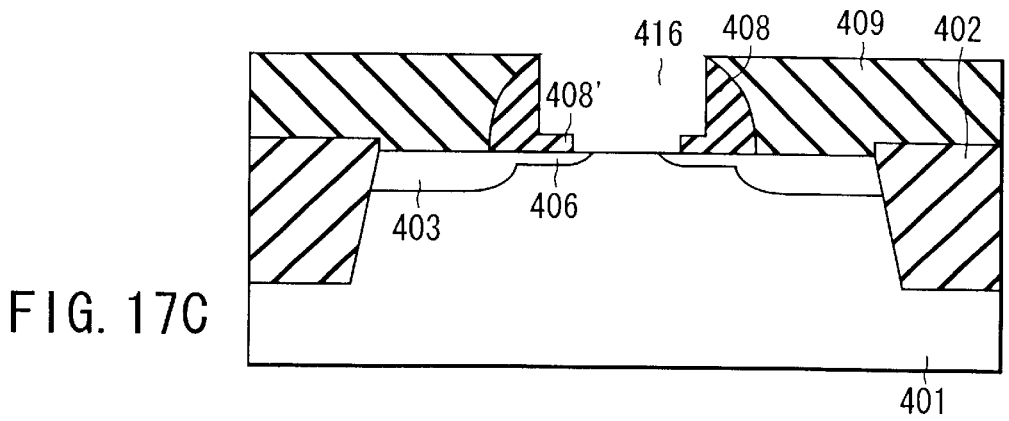

In the next step, the gate dummy pattern 414 is selectively removed so as to form a groove 416 for burying the groove, as shown in FIG. 17C. Where the gate dummy pattern 414 is made of polysilicon, it is possible to remove selectively the gate dummy pattern 414 by CDE using an etching gas such $CF_4$ or by using a mixed acid consisting of hydrofluoric acid and $HNO_3$. In the case of using the mixed acid, it is possible to control appropriately the selectivity ratio between the oxide film and the polysilicon film (gate dummy pattern 414) by adjusting the ratio of the hydrofluoric acid in the mixed acid. Then, the insulating film 412 formed first is removed so as to form a terrace type spacer 408'. In this case, if the side wall insulating film 408 is formed of a silicon nitride film, it is possible to remove the insulating film 412 by the treatment with hydrofluoric acid.

Figure 18A:
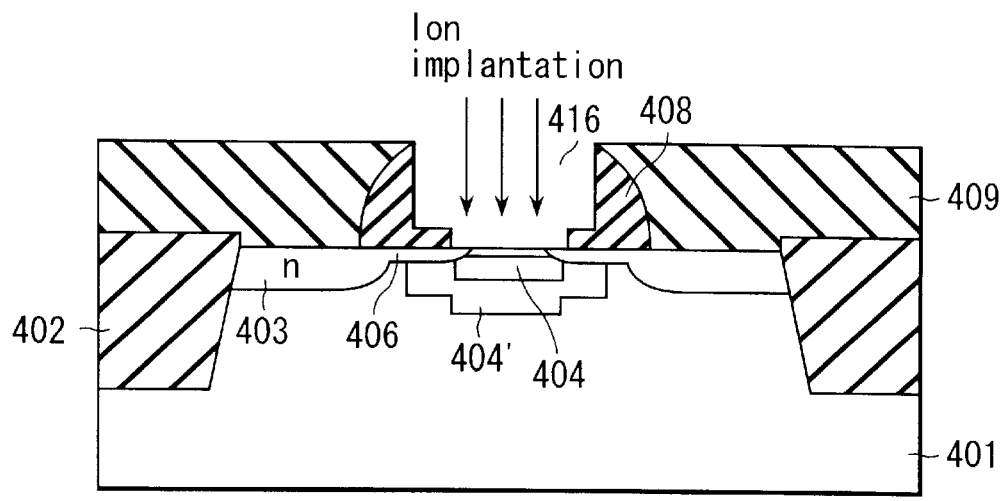

Then, in the case of an N-type MOSFET, an impurity for forming a channel region such as phosphorus or arsenic is implanted into the semiconductor substrate 401 by means of ion implantation so as to form a buried channel region 404, as shown in FIG. 18A. In this step, it is possible to dope the impurity into only a specified region of the semiconductor substrate 401 within the groove 416 for burying the gate by controlling the accelerating energy for ion implantation. Also, a punch-through stopper region 404' is formed by introducing an impurity of the conductivity type equal to that of the impurity contained in the semiconductor substrate 401 by means of ion implantation such that the particular impurity is introduced deeper than the impurity for forming the buried channel.

Figure 18B:
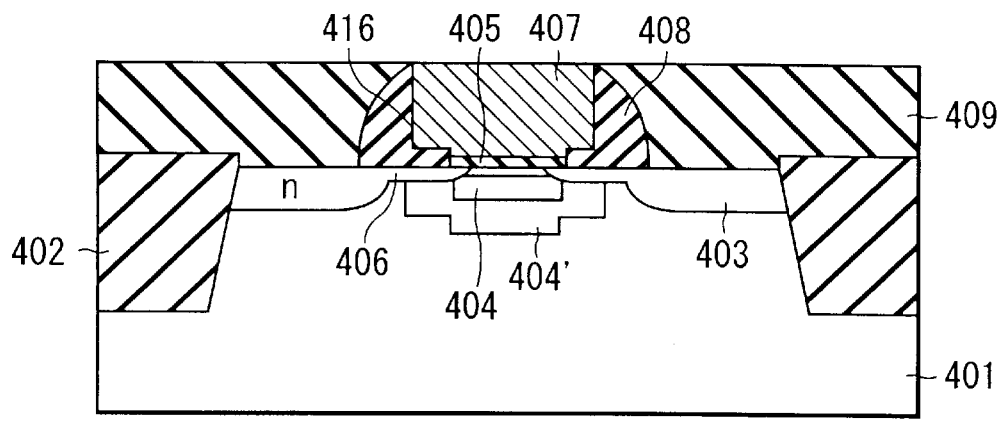
Figure 19A:
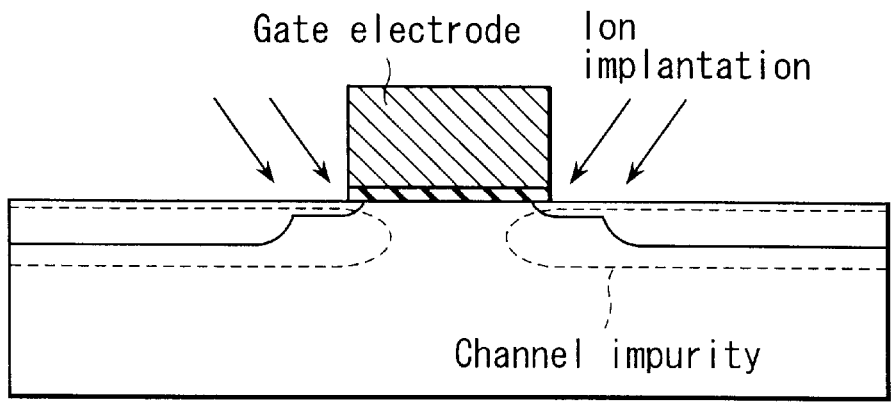
FIGS. 19A, 19B and 19C are cross sectional views each showing the construction of a semiconductor substrate, which is used for describing the construction of a conventional semiconductor device.
Figure 19B:
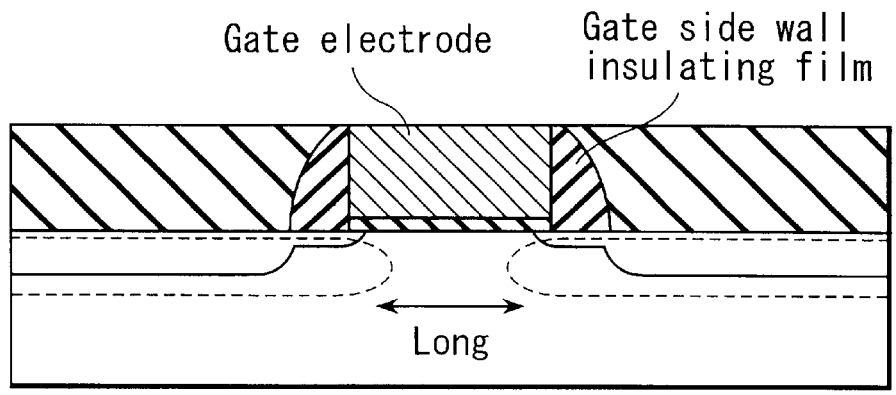
Figure 19C:
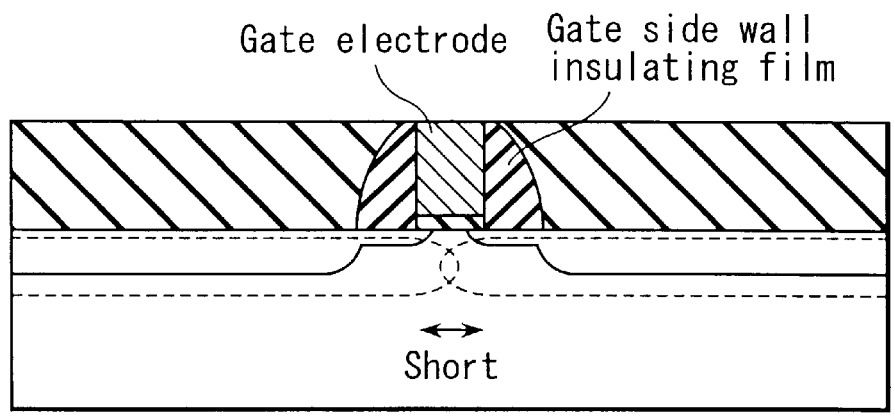

In the next step, a gate insulating film 405 and a gate electrode 407 are formed within the groove 416 for burying the electrode, as shown in FIG. 18B. In the case of using the gate insulating film 405 consisting of a thermal oxide film prepared by oxidizing the semiconductor substrate 401, the gate insulating film 405 is formed thinner than the terrace type spacer 408'. For example, the gate insulating film 405 is formed to a thickness that permits maintaining the step with the terrace type spacer 408'. Also, in the case of a damascene metal gate structure, the gate electrode 407 is formed by forming first a laminate structure consisting of a TiN layer and a W layer, followed by planarizing the surface of the laminate structure by, for example, CMP. It is also possible to perform an impurity doping in the case of using polysilicon as a material of the gate electrode by using a similar process.

Finally, an insulating film 410 is formed on the insulating film 409, followed by forming contact holes extending through the insulating films 410 and 409 so as to form connection wirings 411, 411' connected to the source-drain regions 403, as shown in FIG. 14.

In the third embodiment of the present invention described above, the side wall insulating film 408 such as a silicon nitride film is buried in the side etching groove 415 so as to form the projecting portion 408' of the side wall insulating film 408 in a manner to extend into a region below the gate dummy pattern 414. Then, after the gate dummy pattern 414 and the oxide film 412 positioned below the gate dummy pattern 414 are removed, the side wall insulating film 408 is allowed to remain, followed by performing the doping of the impurity for controlling the threshold value. As a result, the short channel characteristics are improved so as to allow punch-through to be unlikely to take place even if the channel length is decreased, thereby ensuring the reliability of the gate edge.

It is also possible to suppress the elevation of the threshold value caused by the channel stopper while suppressing effectively the short channel effect by performing in a self-aligned fashion the impurity doping for forming the punch-through stopper region 404' right under the extension region 406 and the impurity doping for controlling the threshold value.

It is also possible to control optionally the height and the length in the lateral direction of the terrace type spacer (projecting portion of the side wall insulating film) 408' at both edge portions of the region where the channel is to be formed by employing the process according to the third embodiment of the present invention in the process for forming a damascene gate transistor. As a result, it is possible to improve the controllability in terms of the overlapping capacitance between the gate electrode 407 and the extension region 406 or between the gate electrode 407 and the source-drain regions 403, the junction capacitance between the channel region and the extension region 406 or between the channel region and the source-drain regions 403, the effective gate length, and the channel profile in the lateral direction so as to increase the degree of freedom in the design of the channel.

It should be noted in particular that it is possible to form the very shallow buried channel region 404 apart from the source-drain regions 403 by an optional distance in the damascene metal gate process, in which the source-drain regions 403 are formed with the dummy gate pattern 414 once formed used as a mask, the dummy gate pattern 414 is removed after activation of the source-drain regions, the gate insulating film 405 is formed again after ion implantation into the channel region and, then, the metal electrode material is buried. It is also possible to form the impurity region used as the punch-through stopper region 404' together with the buried channel region 404 apart from the source-drain regions 403 in a self-aligned fashion such that the impurity region noted above is formed shallow in the edges of the source-drain regions 403 and deep in the central portion of the channel region. As a result, it is possible to form a transistor free from deterioration of the short channel characteristics in the buried channel region 403'.

Further, in the case of forming a surface channel type transistor comprising the gate electrode 407 formed of polysilicon or two kinds of metallic material differing from each other in the work function, it is possible to form similarly the punch-through stopper region 404' in a self-aligned fashion apart from the source-drain regions 403 such that the punch-through stopper region 404' is shallow in the edge portions of the source-drain regions 403 and deep in the central portion of the channel region.

Still further, in the case of both the buried channel type and the surface channel type, it is possible to suppress the parasitic capacitance between the gate electrode 407 and the source-drain regions 403 and the parasitic capacitance between the source-drain regions 403 and the semiconductor substrate 401.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

a pair of first diffusion layers formed within said semiconductor substrate;

a gate insulating film formed on that portion of said semiconductor substrate which is positioned between said paired diffusion layers;

a gate electrode including a first gate portion formed on said gate insulating film and a second gate portion formed on said first gate portion, a first width in a channel direction of said first gate portion being substantially equal to a width in said channel direction of said gate insulating film, and a second width in said channel direction of said second gate portion being larger than said first width;

a gate side wall insulating film including a first side wall portion formed on a side surface of said first gate portion and on a side surface of said gate insulating film and a second side wall portion formed on a side surface of said second gate portion;

a second diffusion layer formed apart from said first diffusion layers within that portion of said semiconductor substrate which is positioned below said gate insulating film; and a third diffusion layer including a first diffusion portion formed below said first diffusion layers under said first side wall portion and a second diffusion portion formed below said second diffusion layer, wherein a distance of a peak portion of a impurity concentration in said first diffusion portion from a surface of said semiconductor substrate is less than a distance of a peak portion of a impurity concentration in said second diffusion portion from the surface of said semiconductor substrate, and wherein a conductivity type of said third diffusion layer is equal to the conductivity type of said semiconductor substrate.

2. The semiconductor device according to claim 1, wherein said first diffusion layers further comprises:

a pair of extension regions formed below said second side wall portion apart from said second diffusion layer; and a pair of source-drain regions formed in contact with said extension regions on a side opposite said second diffusion layer.

3. The semiconductor device according to claim 1, further comprising an interlayer insulating film formed to surround said gate side wall insulating film, an upper surface of said interlayer insulating film being substantially equal to an upper surface of said gate electrode.

4. The semiconductor device according to claim 1, wherein a conductivity type of said second diffusion layer is opposite the conductivity type of said semiconductor substrate.

5. The semiconductor device according to claim 1, wherein said gate insulating film is thicker than said first side wall portion.

* * * * *